US012740241B2

(12) United States Patent
Choi

(10) Patent No.: US 12,740,241 B2
(45) Date of Patent: Sep. 15, 2026

(54) DISPLAY APPARATUS

(71) Applicant: LG Display Co., Ltd., Seoul (KR)

(72) Inventor: So-Hee Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 414 days.

(21) Appl. No.: 18/336,017

(22) Filed: Jun. 16, 2023

(65) Prior Publication Data

US 2023/0337470 A1 Oct. 19, 2023

(30) Foreign Application Priority Data

Jun. 30, 2022 (KR) ........................ 10-2022-0080928

(51) Int. Cl.

| | |
|---|---|
| ***H10K 59/121*** | (2023.01) |
| ***G09G 3/3233*** | (2016.01) |
| *G06F 3/041* | (2006.01) |
| *G06F 3/044* | (2006.01) |

(52) U.S. Cl.

CPC ....... *H10K 59/1213* (2023.02); *G09G 3/3233* (2013.01); *G06F 3/0412* (2013.01); *G06F 3/0446* (2019.05); *G09G 2300/0819* (2013.01); *G09G 2300/0842* (2013.01); *G09G 2300/0861* (2013.01); *G09G 2320/0233* (2013.01); *G09G 2354/00* (2013.01)

(58) Field of Classification Search

CPC .............. H10K 59/1213; G09G 3/3233; G06F 3/0446; G06F 3/0412

USPC ........................................................... 257/43

See application file for complete search history.

(56) References Cited

U.S. PATENT DOCUMENTS

| | | | | |
|---|---|---|---|---|
| 2017/0162606 | A1* | 6/2017 | Yan | H10D 30/6734 |
| 2017/0243537 | A1* | 8/2017 | Wu | G09G 3/3233 |
| 2017/0278869 | A1* | 9/2017 | Hiramatsu | H10D 86/423 |
| 2017/0278916 | A1* | 9/2017 | Maruyama | H10K 59/1213 |
| 2018/0166025 | A1* | 6/2018 | Zhou | G09G 3/3233 |

(Continued)

FOREIGN PATENT DOCUMENTS

| | | |
|---|---|---|
| CN | 110648629 A | 1/2020 |
| CN | 112670305 A | 4/2021 |

(Continued)

OTHER PUBLICATIONS

English Machine Translation of KR 2021/0086472. (Year: 2021).*
Korean Intellectual Property Office, Office Action, Korean Patent Application No. 10-2022-0080928, Jul. 29, 2025, 11 pages.

*Primary Examiner* — Dzung Tran

(74) *Attorney, Agent, or Firm* — Fenwick & West LLP

(57) ABSTRACT

A display apparatus includes a pixel and four thin film transistors (TFTs). The pixel includes a light emitting element that includes first and second electrodes and a light emitting layer. A first TFT, including a first semiconductor layer, is configured to provide a driving current to the light emitting element according to a data voltage. A second TFT, including a second semiconductor layer, is configured to control driving of the first TFT according to a gate voltage. A third TFT, including a third semiconductor layer, is configured to sense a threshold voltage of the first TFT to control driving of the first TFT. A fourth TFT, including a fourth semiconductor layer, is in the gate driving portion, configured to apply gate voltages to the second and third TFTs, wherein the fourth semiconductor layer is in a different layer from the first, second and third semiconductor layers.

15 Claims, 6 Drawing Sheets

(56) References Cited

U.S. PATENT DOCUMENTS

2020/0226978 A1 7/2020 Lin et al.
2021/0134224 A1 5/2021 He et al.
2021/0202634 A1 * 7/2021 Moon .................... H10D 86/60
2021/0249491 A1 * 8/2021 Kim ..................... H10K 59/131
2022/0165806 A1 * 5/2022 Yun ...................... H10K 59/126
2022/0208797 A1 6/2022 Lai et al.

FOREIGN PATENT DOCUMENTS

KR 10-2017-0081060 A 7/2017
KR 10-2019-0080207 A 7/2019
KR 10-2020-0087711 A 7/2020
KR 10-2021-0086472 A 7/2021

* cited by examiner

FIG. 1

DISPLAY APPARATUS

CROSS REFERENCE TO RELATED APPLICATIONS

The present application claims the priority to and benefit of Republic of Korea Patent Application No. 10-2022-0080928 filed in Republic of Korea on Jun. 30, 2022, which is hereby incorporated by reference in its entirety.

BACKGROUND

Technical Field

The present disclosure relates to a display apparatus, specifically relates to a display apparatus comprising multiple thin film transistors.

Discussion of the Related Art

As an information society develops, demand for display apparatuses displaying images increases, and various types of display apparatuses such as a liquid crystal display apparatus and an organic light emitting display apparatus are used.

As a display apparatus used in a computer monitor, a TV, a mobile phones, etc., there is an organic light emitting display (OLED) apparatus that emit light by themselves, a liquid crystal display (LCD) apparatus that require a separate light source, or the like.

Compared to the liquid crystal display apparatus, the organic light emitting display apparatus does not use a separate light source and uses self-emitting light emitting elements, so it is thin and has excellent image quality and is becoming a trend in the display field. In particular, since a light emitting element can be formed on a flexible substrate, a screen can be configured in various forms such as bending or folding, making it suitable for various display application products.

A display apparatus for smart watches and monitors with many still images among the application products requires a light emitting display apparatus which includes a new type of a driving element portion capable of preventing or at least reducing leakage current in the still image, and a technology using an oxide semiconductor layer as an active layer of a thin film transistor constituting a driving element portion has been developed.

SUMMARY

An advantage of the present disclosure is to provide a display device that can reduce a parasitic capacitance of a sampling transistor while maintaining a voltage-current characteristics of a driving transistor in the display apparatus, thereby improving non-uniformity in initial luminance of the display apparatus and decrease in luminance during a reliability test.

Another advantage of the present disclosure is to provide a display device that can secure optimum characteristics of each transistor element through a structure in which a thickness (or height) of a gate insulating layer of each transistor is differently designed.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

Embodiments described herein achieve the above-described advantages. In one embodiment, a display apparatus includes a substrate, a pixel in the display area, a first thin film transistor, a second thin film transistor, a third thin film transistor, and a fourth thin film transistor. The substrate includes a display area, and a non-display area that includes a wiring portion, a dam portion and a gate driving portion. The pixel is in the display area, electrically connected to a gate line and a data line crossing the gate line, the pixel including a light emitting element that includes a first electrode, a light emitting layer and a second electrode. The first thin film transistor provides a driving current to the light emitting element according to a data voltage applied from the data line, and including a first semiconductor layer. The second thin film transistor is configured to control driving of the first thin film transistor according to a gate voltage applied from the gate line, the first thin film transistor including a second semiconductor layer. The third thin film transistor is configured to sense a threshold voltage of the first thin film transistor to control driving of the first thin film transistor, the third thin film transistor including a third semiconductor layer. The fourth thin film transistor is in the gate driving portion, configured to apply gate voltages to the plurality of second thin film transistors and the third thin film transistor, the fourth thin film transistor including a fourth semiconductor layer, wherein the fourth semiconductor layer is at a different layer from the first semiconductor layer, the second semiconductor layer and the third semiconductor layer.

In one embodiment, a display apparatus includes a substrate, a light emitting element above the substrate, a first thin film transistor, and a third thin film transistor. The substrate includes a display area where an image is displayed. The first thin film transistor is configured to provide a driving current to the light emitting element according to a data voltage applied from a data line. The first thin film transistor includes a first semiconductor layer including oxide semiconductor and at least a first gate electrode. The third thin film transistor is configured to sense a threshold voltage of the first thin film transistor. The third thin film transistor includes a third semiconductor layer including oxide semiconductor and at least a third gate electrode. A distance between the third semiconductor layer and the third gate electrode is greater than a distance between the first semiconductor layer and the first gate electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings:

FIG. 1 is a plan view illustrating a display apparatus according to an embodiment of the present disclosure;

DETAILED DESCRIPTION

Figure 2:
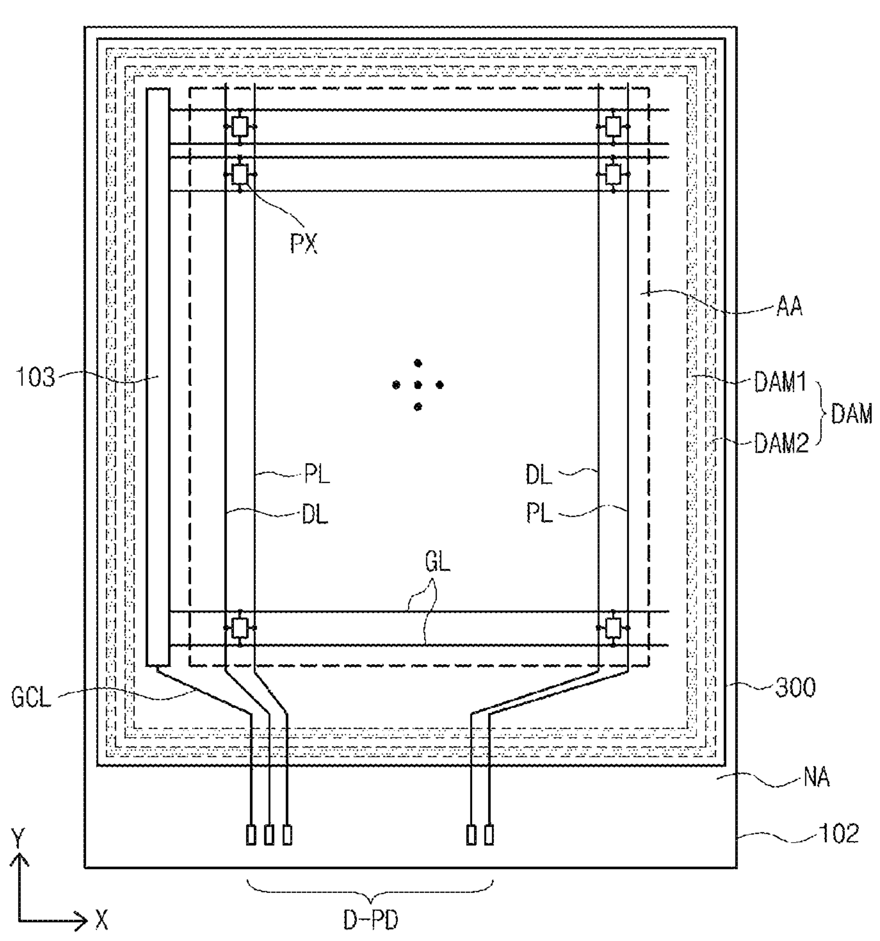
FIG. 2 is a plan view of a display apparatus according to an embodiment of the present disclosure.

Advantages and features of the present disclosure and methods of achieving them will be apparent with reference to the embodiments described below in detail with the accompanying drawings. However, the present disclosure is not limited to the embodiments disclosed below, but can be realized in a variety of different forms, and only these embodiments allow the present disclosure to be complete. The present disclosure is provided to fully inform the scope of the disclosure to the skilled in the art of the present disclosure, and the present disclosure may be defined by the scope of the claims.

The shapes, sizes, proportions, angles, numbers, and the like disclosed in the drawings for explaining the embodiments of the present disclosure are illustrative, and the present disclosure is not limited to the illustrated matters. The same reference numerals refer to the same components throughout the description. Furthermore, in describing the present disclosure, if it is determined that a detailed description of the related known technology unnecessarily obscure the subject matter of the present disclosure, the detailed description thereof can be omitted. When 'comprising', 'including', 'having', 'comprising', and the like are used in this disclosure, other parts can be added unless 'only' is used. When a component is expressed in the singular, cases including the plural are included unless specific statement is described.

In interpreting the components, even if there is no separate explicit description, it is interpreted as including a margin range.

In the case of a description of a positional relationship, for example, when the positional relationship of two parts is described as 'on', 'over', 'above', 'below', 'beside', 'under', and the like, one or more other parts can be positioned between such two parts unless 'right' or 'directly' is used.

In the case of a description of a temporal relationship, for example, when a temporal precedence is described as 'after', 'following', 'before', and the like, cases that are not continuous can be included unless 'directly' or 'immediately' is used.

In describing components of the present disclosure, terms such as first, second, A, B, (a), (b) and the like can be used. These terms are only for distinguishing the components from other components, and an essence, order, order, or number of the components is not limited by the terms. Further, when it is described that a component is "connected", "coupled" or "contact" to another component, the component can be directly connected or contact the another component, but it should be understood that other component can be "interposed" between the components.

Respective features of various embodiments of the present disclosure can be partially or wholly connected to or combined with each other and can be technically interlocked and driven variously, and respective embodiments can be independently implemented from each other or can be implemented together with a related relationship.

In this disclosure, a "display apparatus" can include a display apparatus in narrow sense, such as a liquid crystal module (LCM), an organic light emitting display module (OLED module), a quantum dot (QD) module or the like, including a display panel and a driving portion for driving the display panel. Furthermore, the "display apparatus" can include a complete product or final product which is a notebook computer, a television, a computer monitor, an automotive device or equipment display including other type of vehicle, or a set electronic device or set device or set apparatus such as a mobile electronic device which is a smart phone, an electronic pad or the like, including the LCM, OLED module, the QD module or the like.

Therefore, the display apparatus of this disclosure can include a display apparatus in narrow sense itself such as the LCM, OLED module, QD module or the like, and/or an application product or a set device that is an end-user device, including the LCM, OLED module, QD module or the like.

Further, in some embodiments, the LCM, OLED module, QM module or the like configured with a display panel and a driving portion can be expressed as a "display apparatus" in a narrow sense, and an electronic apparatus as a final product including the LCM, OLED module, QM module or the like may be distinguished and expressed as a "set device." For example, the display apparatus in a narrow sense can include a liquid crystal, organic light emitting diode (OLED) or quantum dot display panel, and a source PCB that is a control portion for driving the display panel. The set device can further include a set PCB which is a set control portion electrically connected to the source PCB to drive the entire set device.

The display panel used in embodiments of the present disclosure can use all types of display panels such as a liquid crystal display panel, an organic light emitting diode (OLED) display panel, a quantum dot (QD) display panel and an electro-luminescent display panel, but the embodiments are not limited thereto. The display panel of this disclosure is not limited to a specific display panel capable of bezel bending with a flexible substrate and a lower back plate supporting structure for an organic light emitting diode (OLED) display panel. The display panel applied to the display apparatus according to embodiments of the present disclosure is not limited to a shape or a size of the display panel.

For example, if the display panel is an organic light emitting (OLED) display panel, it can include a plurality of gate lines and data lines, and pixels formed at intersections of the gate lines and/or data lines. In addition, the display panel can be configured to include an array including a thin film transistor as an element for selectively applying a voltage to each pixel, a light emitting element layer on the array, and an encapsulation substrate or an encapsulation layer disposed on the array to cover the light emitting element layer. The encapsulation layer can protect the thin film transistor and the light emitting element layer from an external impact, and can prevent or at least reduce penetration of moisture or oxygen into the light emitting element layer. In addition, a layer formed on the array can include an inorganic light emitting layer, for example, a nano-sized material layer or quantum dots.

Hereinafter, embodiments of a display device, which can reduce a parasitic capacitance of a sampling transistor while maintaining a voltage-current characteristic of a driving transistor in the display apparatus, thereby improving non-uniformity in initial luminance of the display apparatus and improving decrease in luminance during a reliability test, are described.

Figure 1:
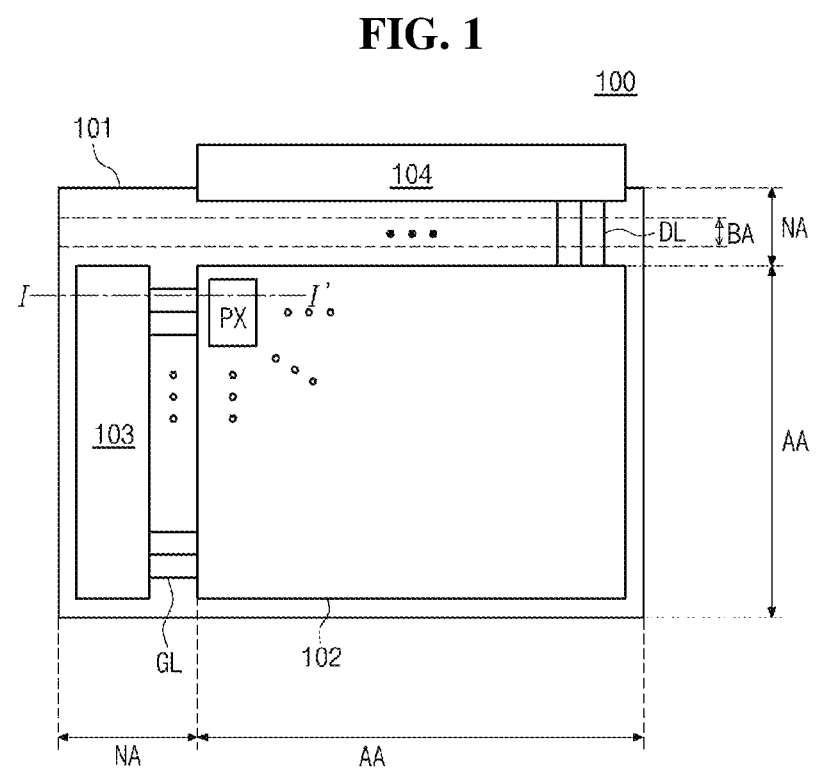

FIG. 1 is a plan view illustrating a display apparatus according to an embodiment of the present disclosure.

Referring to FIG. 1, the display apparatus 100 may include elements such as a display panel 102, a gate driving portion 103, and a data driving portion 104 on a substrate 101. The substrate 101 may be divided into a display area AA including the display panel 102 and a non-display area NA including the gate driving portion 103 and the data driving portion 104.

The substrate 101 may be made of glass or plastic, but is not necessarily limited thereto, and may be made of a semiconductor material such as a silicon wafer.

The substrate 101 may be formed of a plastic material having flexibility. For example, the substrate 101 may be formed of a single layer or multiple layers using at least one of polyimide (PI), polyethylene terephthalate (PET), polyethylene naphthalate (PEN), polycarbonate (PC), polyethersulfone (PES), polyarylate (PAR), polysulfone (PSF), cyclic-olefin copolymer (COC) and the like, but is not limited thereto.

The display area AA may be an area in which a plurality of sub-pixels PX are disposed to display an image. Each of the plurality of sub-pixels PX may be an individual unit emitting light, and a light emitting element and a driving circuit may be disposed in each of the plurality of sub-pixels PX. For example, a display element for displaying an image and a circuit portion for driving the display element may be disposed in the plurality of sub-pixels PX. For example, when the display apparatus 100 is an organic light emitting display apparatus, the display element may include an organic light emitting element, and when the display apparatus 100 is a liquid crystal display apparatus, the display element may include a liquid crystal element. The plurality of sub-pixels PX may include a red sub-pixel PX, a green sub-pixel PX and a blue sub-pixel PX, and optionally a white sub-pixel PX, but are not limited thereto.

The non-display area NA may be an area in which an image is not displayed. The non-display area NA may be an area where various wires and driving ICs for driving the plurality of sub-pixels PX disposed in the display area AA are disposed. For example, at least one of the data driving portion 104 and the gate driving portion 103 may be disposed in the non-display area NA, but is not limited thereto.

The non-display area NA may be an area surrounding the display area AA. For example, the non-display area NA may be an area extending from the display area AA or an area in which a plurality of sub-pixels PX are not disposed, but is not limited thereto. The non-display area NA where no image is displayed may be a bezel area and may further include a bending area BA where the substrate 101 is bent, but is not limited thereto.

The sub-pixel PX of the display area AA may include a thin film transistor (TFT). A semiconductor layer of the thin film transistor in the display area AA may be formed of a polycrystalline semiconductor material and/or an oxide semiconductor material, but is not limited thereto.

A thin film transistor (TFT) may be included in the gate driving portion 103 of the non-display area NA. A semiconductor layer of the thin film transistor in the non-display area NA may be formed of a polycrystalline semiconductor material, but is not limited thereto.

The gate driving portion 103 may be directly formed on the substrate 101, or may be formed by configuring a C-MOS with a thin film transistor using a polycrystalline semiconductor material as a semiconductor layer and a thin film transistor using an oxide semiconductor material as a semiconductor layer. Accordingly, since electron mobility can be increased in a channel of the thin film transistor, it is possible to implement a display apparatus with high resolution and low power consumption.

A plurality of data lines DL and a plurality of gate lines GL may be disposed in the display area AA. For example, the plurality of data lines DL may be arranged in rows or columns, and the plurality of gate lines GL may be arranged in columns or rows. In the display panel 102, the sub-pixels PX may be disposed in areas defined by crossing of the plurality of data lines DL and the plurality of gate lines GL.

The gate driving portion 103 including a gate driving circuit (or scan driving circuit) may be disposed in the non-display area NA. The gate driving circuit of the gate driving portion 103 may sequentially drive each pixel row of the display area AA by sequentially supplying scan signals to the plurality of gate lines GL.

The gate driving circuit of the gate driving portion 103 may be formed of a thin film transistor having a polycrystalline semiconductor layer, may be formed of a thin film transistor having an oxide semiconductor layer, or may be formed of a pair of a thin film transistor having a polycrystalline semiconductor layer and a thin film having an oxide semiconductor layer. When the same semiconductor material is used for the thin film transistors disposed in the non-display area NA and the display area AA, the transistors may be simultaneously formed in the same process.

The gate driving circuit may include a shift register, a level shifter, and the like, and, like the display apparatus 100 according to the embodiment of the present disclosure, the gate driving circuit may be implemented in a gate in panel (GIP) in the process of forming the display panel 102 and may be directly disposed on the substrate 101. The gate driving portion 103 including the gate driving circuit may sequentially supply scan signals of an on voltage or an off voltage to the plurality of gate lines GL.

The data driving portion 104 may convert image data into analog data voltages and supply them to the plurality of data lines DL when a specific gate line GL is open by the gate driving portion 103 including the gate driving circuit.

The plurality of gate lines GL disposed on the substrate 101 may include a plurality of scan lines and a plurality of emission control lines. The plurality of scan lines and the plurality of light emission control lines may be wires that transmit different types of gate signals (e.g., scan signals and emission control signals) to gate nodes of different types of transistors (e.g., scan transistors and emission control transistors).

The gate driving portion 103 including the gate driving circuit may include a scan driving circuit that outputs scan signals to the plurality of scan lines, which are one kind of gate lines GL, and an emission driving circuit that outputs emission control signals to the plurality of emission control lines which are another kind of gate lines.

The data line DL may pass through a bending area BA, and various data lines DL may be disposed and connected to data pads PAD.

The bending area BA may be an area where the substrate 101 is bent. The substrate 101 may be maintained in a flat state except for the bending area BA.

FIG. 2 is a plan view of a display apparatus according to an embodiment of the present disclosure.

Referring to FIG. 2, the display apparatus 100 may include the display panel 102 which includes a driving element portion including a plurality of thin film transistors for image display, a light emitting element portion in which a light emitting element layer including a plurality of light emitting elements is stacked, an encapsulation portion 300 disposed to seal the light emitting element layer, and a touch sensor portion which is disposed on the encapsulation portion 300 with an organic buffer layer of a high thickness interposed between the touch sensor portion and the encapsulation portion 300 and the touch sensor portion has a touch sensing function. An end of the high-thickness organic buffer layer and an end of the high-thickness encapsulation portion 300 are arranged in a stepped shape to have a stepped end profile. In addition, the display apparatus 100 may further include an optical function film including a polarizing film attached to the touch sensor portion, an optically clear adhesive (OCA), a cover substrate, and a protective film.

The display panel 102 has a structure in which the driving element portion including a plurality of pixel circuits disposed in the display area AA and the light emitting element portion including a plurality of light emitting elements disposed in the display area AA are stacked.

A wiring portion including a plurality of signal lines and a plurality of display pads D-PD connected to the display area AA may be positioned in the non-display area NA of the display panel 102. The signal lines of the non-display area NA may include a link line, a power supply line PL, etc., respectively connected to the signal lines GL, DL, etc., of the display area AA. The plurality of display pads D-PD for connecting the signal lines of the non-display area NA to the display driving portion may be disposed on the wiring portion provided at one side of the non-display area NA. Meanwhile, the driving element portion may include a lower pad among the display pads D-PD, and may have a structure connected to an upper pad disposed in the touch sensor portion to be described later.

The gate driving portion 103 driving the plurality of gate lines GL of the display area AA may be disposed at one side or both sides of the non-display area NA of the display panel 102. The gate driving portion 103 including a plurality of thin film transistors may be formed in the driving element portion together with a thin film transistor array of the display area AA. The gate driving portion 103 may receive control signals from the display driving portion through signal lines GCL and pads D-PD disposed in the non-display area NA.

The display driving portion may be mounted on the wiring portion where the display pads D-PD are located, or may be mounted on a circuit film, and may be connected to the display pads D-PD through an anisotropic conductive film. The circuit film may be any one of COF (Chip On Film), FPC (Flexible Printed Circuit), and FFC (Flexible Flat Cable), but is not limited thereto. The display driving portion may include a timing controller, a gamma voltage generator, and the data driving portion 104.

The encapsulation portion 300 disposed on the display panel 102 may be disposed to overlap the entire display area AA, and extend into the non-display area NA and overlap a dam portion DAM disposed in the non-display area NA. The encapsulation portion 300 may seal and protect the light emitting element portion of the display panel 102. The encapsulation portion 300 may include a laminated structure of a plurality of inorganic encapsulation layers that block penetration of moisture and oxygen, and at least one organic encapsulation layer that blocks inflow or flow of particles. The encapsulation portion 300 may have a structure in which an organic encapsulation layer having a thickness large enough to sufficiently cover particles is disposed between inorganic encapsulation layers having a small thickness. The organic encapsulation layer may be called a particle cover layer (PCL).

The dam portion DAM may be disposed in the non-display area NA to restrain an end portion of the organic encapsulation layer of the encapsulation portion 300, thereby preventing or at least reducing a likelihood of the organic encapsulation layer from flowing down or collapsing. For example, the dam portion DAM may include a plurality of dams DAM1 and DAM2 in a closed loop form surrounding an area including the display area AA of the display panel 102 and the gate driving portion 103.

Figure 3:
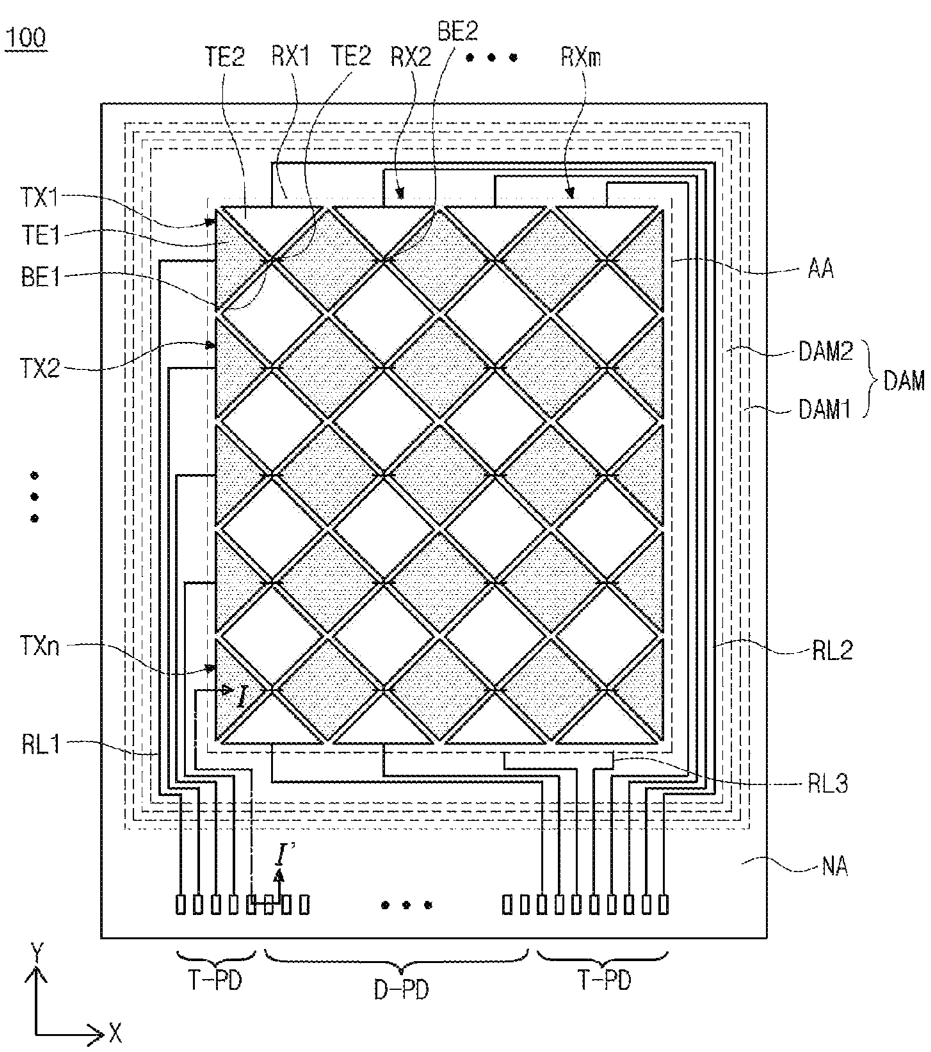
FIG. 3 is a plan view illustrating a display apparatus according to an embodiment of the present disclosure.

FIG. 3 is a plan view of a display apparatus according to an embodiment of the present disclosure.

Referring to FIG. 3, the touch sensor portion on the encapsulation portion 300 may use a capacitance method that provides a signal reflecting a capacitance change amount due to a user's touch to a touch driving portion. The touch sensor portion may use a self-capacitance method in which a signal reflecting a capacitance change of each touch electrode is independently provided to the touch driving portion, or a mutual capacitance method in which a signal reflecting a capacitance change amount between first and second touch electrodes is provided to the touch driving portion, but embodiments of the present disclosure are not limited thereto. Hereinafter, in an embodiment of the present disclosure, the mutual capacitance type touch sensor portion is described as an example.

The touch sensor portion may include a plurality of touch electrodes TE1 and TE2 and a plurality of connection electrodes BE1 and BE2 disposed in the display area AA to provide capacitance type touch sensors. The touch sensor portion may include a plurality of routing lines RL1, RL2 and RL3, and a plurality of touch pads T-PD disposed in the non-display area NA. When forming the touch sensor portion, upper pads of the display pads D-PD may be formed of the same metal material and at the same layer as upper pads of the touch pads T-PD, and be formed of the same metal material and at the same layer as the touch electrodes TE1 and TE2.

The touch sensor portion may include a plurality of first touch electrode channels TX1 to TXn configured with the plurality of first touch electrodes TE1 arranged in a first direction (or X-axis direction, or horizontal direction) in the display area AA and electrically connected, and a plurality of second touch electrode channels RX1 to RXm configured with the plurality of second touch electrodes TE2 arranged in a second direction (or Y-axis direction, or vertical direction) in the display area AA and electrically connected. Adjacent first and second touch electrodes TE1 and TE2 may configure each touch sensor of a mutual capacitance type.

Each of the first touch electrodes TE1 arranged in the first direction X in each first touch electrode channel TXi (i=1 to n) may be connected to the adjacent first touch electrode TE1 through the first connection electrode BE1. Each of the second touch electrodes TE2 arranged in the second direction Y in each second touch electrode channel RXi (i=1 to m) may be connected to the adjacent second touch electrode TE2 through the second connection electrode BE2. The first touch electrode TE1 may be referred to as a transmission (Tx) electrode, and the second touch electrode TE2 may be referred to as a receiving (Rx) electrode. The first touch electrode channels TX1 to TXn may be referred to as transmission channels, and the second touch electrode channels RX1 to RXm may be referred to as receiving channels or read-out channels. Each of the first and second touch electrodes TE1 and TE2 may be usually formed in a diamond shape, but is not limited thereto.

In the non-display area NA of the touch sensor portion, the plurality of touch routing lines RL1, RL2 and RL3 connected to the touch electrode channels TX1 to TXn and RX1 to RXm of the display area AA and the plurality of touch pads T-PD connected to the plurality of touch routing lines RL1, RL2 and RL3 may be disposed. The plurality of touch routing lines RL1, RL2 and RL3 may overlap the encapsulation portion 300 in the non-display area NA surrounding the display area AA. The touch driving portion may be mounted on a circuit film and connected to the touch pads T-PD disposed in the non-display area NA through an anisotropic conductive film.

One sides of the plurality of first touch electrode channels TX1 to TXn disposed in the display area AA may be connected to the touch driving portion through the plurality of first touch routing lines RL1 disposed and the touch pads T-PD disposed in the non-display area NA. The plurality of first touch routing lines RL1 may be individually connected to the touch pads T-PD disposed in the lower non-display area NA via either one of the left and right non-display areas NA and the lower non-display area NA.

The touch driving portion may drive the plurality of first touch electrode channels TX1 to TXn, receive read-out signals output from the plurality of second touch electrode channels RX1 to RXm, and generate touch sensing data using the read-out signals. For example, the touch driving portion may compare read-out signals of two adjacent channels through a differential amplifier to generate a touch sensing signal indicating presence of a touch, digitally convert the touch sensing signal into touch sensing data, and output the touch sensing data to a touch controller. The touch controller may detect touch coordinates of the touch area based on the touch sensing data and provide the touch coordinates to the host system.

The touch sensor portion according to the embodiment of the present disclosure may be disposed on the encapsulation portion 300 with an organic buffer layer having a thickness similar to that of the encapsulation portion 300 interposed between the touch sensor portion and the encapsulation portion 300 in the display area AA. Accordingly, manufacturing costs can be reduced by simplifying manufacturing processes compared to a method of attaching a touch panel, and touch sensing performance can be improved by reducing parasitic capacitance between the touch sensor portion and the display panel 102, thereby improving product reliability.

The end of the organic buffer layer and the end of the encapsulation layer are arranged in a stepped shape, so that the ends of the high-thickness organic buffer layer and encapsulation portion have a stepped profile. The touch routing lines RL1, RL2 and RL3 may be disposed along the stepped ends of the organic buffer layer and encapsulation portion 300. In particular, each of the touch routing lines RL1, RL2 and RL3 may include a lower routing line disposed along the end of the encapsulation portion 300, and an upper routing line disposed along the end of the organic buffer layer and connected to the lower routing line through a contact hole on the end of the encapsulation portion 300. Accordingly, the touch routing lines RL1, RL2 and RL3 may be stably formed in the stepped end area of the organic buffer layer and the encapsulation portion 300 without disconnection defects, thereby improving product yield and product reliability.

Figure 4:
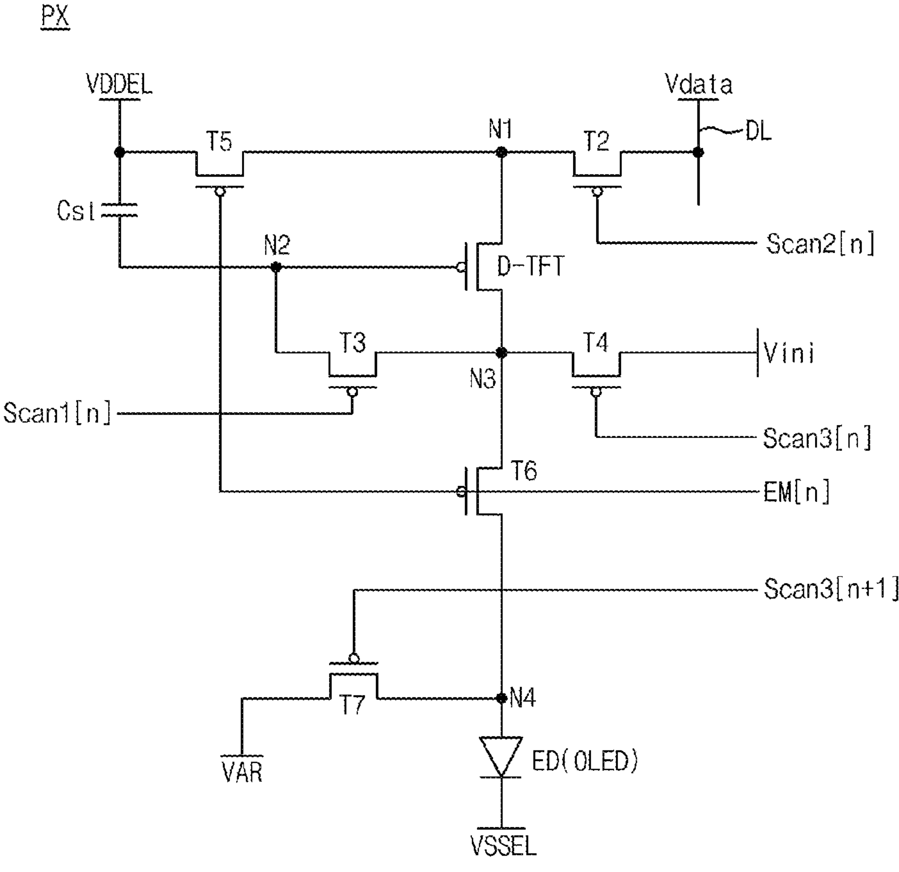
FIG. 4 is a circuit diagram illustrating a pixel driving circuit for driving one pixel in a display apparatus according to an embodiment of the present disclosure.

FIG. 4 is a circuit diagram illustrating a pixel driving circuit for driving one pixel in a display apparatus according to an embodiment of the present disclosure.

Referring to FIG. 4, in the pixel driving circuit according to an embodiment of the present disclosure, a pixel (or pixel, or sub-pixel) PX may include seven thin film transistors and one storage capacitor Cst. For example, one of the seven thin film transistors may be a driving thin film transistor (D-TFT), and the others may be switching thin film transistors (T2 to T7) for internal compensation.

In the pixel driving circuit according to the embodiment of the present disclosure, the driving thin film transistor D-TFT and the switching thin film transistor T3 adjacent to the driving thin film transistor D-TFT may each have a semiconductor layer formed of an oxide semiconductor layer, and at least one of the remaining switching thin film transistors T3 may include a semiconductor layer formed of a polycrystalline semiconductor layer, but is not limited thereto. Each thin film transistor may be a P-type thin film transistor or an N-type thin film transistor.

The N-type thin film transistor may be formed of an oxide transistor formed by using a semiconductor oxide as a semiconductor layer. For example, an oxide transistor may be a transistor having a channel formed from a semiconducting oxide such as indium, gallium or zinc oxide, or IGZO.

The P-type transistor may be a polycrystalline transistor formed by using a semiconductor such as silicon as a semiconductor layer. For example, a polycrystalline transistor may be a transistor having a channel of a polysilicon formed using a low temperature process referred to as LTPS or low temperature polysilicon.

The oxide semiconductor transistor has a relatively lower leakage current than the polycrystalline transistor.

The second transistor T2 may be configured to switch an electrical connection between a first node N1 of the driving transistor D-TFT and the data line DL. The first node N1 of the driving transistor D-TFT may be a source node or a drain node of the driving transistor D-TFT. An operation timing of the second transistor T2 may be controlled by a second scan signal Scan2[*n*]. When the second scan signal Scan2[*n*] of a turn-on level voltage is applied to the second transistor T2, a data voltage Vdata is applied to the first node N1 of the driving transistor D-TFT.

The fifth transistor T5 may be configured to switch an electrical connection between the first node N1 of the driving transistor D-TFT and a high potential driving voltage (VDDEL) line. An operation timing of the fifth transistor T5 may be controlled by an emission signal EM[n]. When the emission signal EM[n] of a turn-on level voltage is applied to the fifth transistor T5, the high potential driving voltage VDDEL is applied to the first node N1 of the driving transistor D-TFT.

The storage capacitor Cst may be configured to apply a voltage corresponding to the data voltage Vdata to a gate node of the driving transistor D-TFT for one frame period. The storage capacitor Cst may include one end electrically connected to the second node N2 of the driving transistor D-TFT, and the other end electrically connected to the high potential driving voltage (VDDEL) line. The second node N2 of the driving transistor D-TFT may be the gate node of the driving transistor D-TFT.

The third transistor T3 may be electrically connected between the second node N2 and the third node N3 of the driving transistor D-TFT. An operation timing of the third transistor T3 may be controlled by the first scan signal Scan1[*n*]. The third node N3 of the driving transistor D-TFT may be another node of a source node or a drain node of the driving transistor D-TFT.

The third transistor T3 may be an oxide semiconductor transistor. Because the oxide semiconductor transistor has a low leakage current, a voltage level of the second node N2 of the driving transistor D-TFT may be maintained constant. Accordingly, even if the data voltage Vdata for image display is not applied for each frame, the pixel PX can display an image on the screen based on the data voltage Vdata for image display input in the previous frame.

The fourth transistor T4 may be configured to switch an electrical connection between the third node N3 of the driving transistor D-TFT and an initialization voltage (Vini) line. The fourth transistor T4 may be controlled by the third scan signal Scan3[*n*]. When the third scan signal Scan3[*n*] of a turn-on level voltage is applied, the initialization voltage Vini is applied to the third node N3 of the driving transistor D-TFT.

The sixth transistor T6 may be configured to switch an electrical connection between the third node N3 of the driving transistor D-TFT and a first electrode of the light emitting element ED. The sixth transistor T6 may include a fourth node N4 and may be electrically connected to the first electrode of the light emitting element ED at the fourth node N4. The fourth node N4 of the sixth transistor T6 may be a source node or a drain node of the sixth transistor T6. The first electrode of the light emitting element ED may be an anode electrode or a cathode electrode. Hereinafter, it is assumed that the first electrode of the light emitting element ED is an anode electrode and described.

An operation timing of the sixth transistor T6 may be controlled by the emission signal EM[n]. The emission signal EM[n] for controlling the operation timing of the sixth transistor T6 may be the same as the emission signal EM[n] for controlling the operation timing of the fifth transistor T5. A gate node of the sixth transistor T6 and a gate node of the fifth transistor T5 may be electrically connected to one emission signal line.

The seventh transistor T7 may be configured to switch an electrical connection between the first electrode of the light emitting element ED and a reset voltage (VAR) line. When the first electrode of the light emitting element ED is an anode electrode, the reset voltage VAR may be an anode reset voltage (VAR).

An operation timing of the seventh transistor T7 may be controlled by the third scan signal Scan3[*n*+1]. The third scan signal Scan3[*n*+1] for controlling the operating timing of the seventh transistor T7 may be the same signal as a third scan signal Scan3 for controlling the operating timing of the fourth transistor T4 of the other sub-pixel PX.

For example, the third scan signal Scan3[*n*+1] may be applied to the seventh transistor T7 included in the sub-pixel PX electrically connected to an $n^{th}$ gate line (n is an integer greater than or equal to 1). The third scan signal Scan3[*n*+1] applied to the sub-pixel PX may be the same signal as the third scan signal Scan3[*n*+1] applied to the fourth transistor T4 included in the sub-pixel PX located on an n+1th gate line.

The first electrode of the light emitting element ED or organic light emitting diode OLED may be electrically connected to the fourth node N4 of the sixth transistor T6. A second electrode of the organic light emitting diode OLED may be electrically connected to a low potential driving voltage (VSSEL) line. The first electrode of the organic light emitting diode OLED may be an anode electrode or a cathode electrode. The second electrode of the organic light emitting diode OLED may be a cathode electrode or an anode electrode.

The high potential driving voltage (VDDEL) line and the low potential driving voltage (VSSEL) line may be common voltage lines commonly connected to the plurality of sub-pixels PX disposed in the display panel 102.

According to the embodiment of the present disclosure, the third transistor T3 may be an N-type transistor, and the remaining transistors may be P-type transistors. The driving transistor D-TFT, the second transistor T2, the fourth transistor T4, the fifth transistor T5, the sixth transistor T6, and the seventh transistor T7 may be P-type transistors, but one or more of the aforementioned transistors may be formed as N-type transistor(s).

Figure 5:
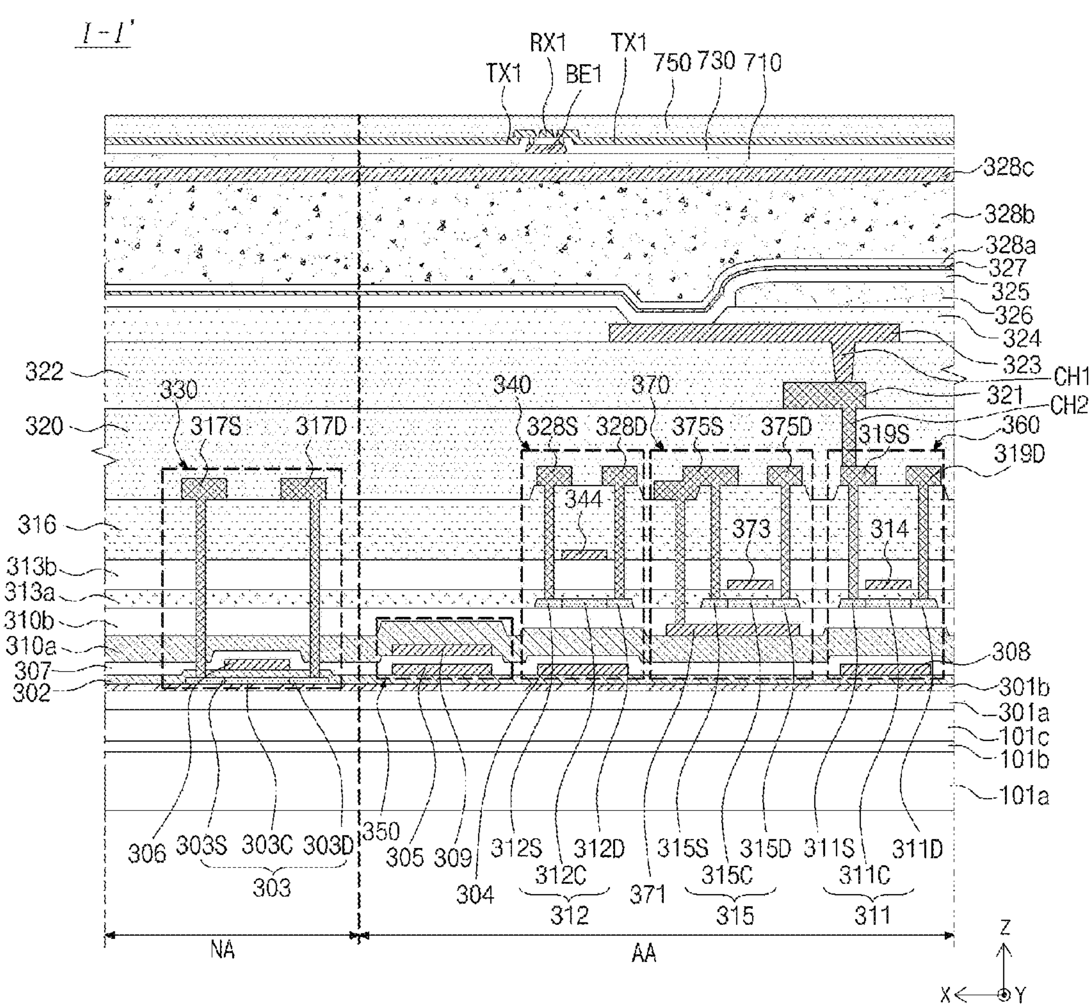
FIG. 5 is a cross-sectional view taken along a line I-I' of FIG. 1 according to an embodiment of the present disclosure.

FIG. 5 is a cross-sectional view taken along a line II' of FIG. 1 according to an embodiment of the present disclosure.

Referring to FIG. 5, the cross-sectional view along the cutting line II' of FIG. 1 shows one driving transistor (D-TFT) (or first thin film transistor) 370, a plurality of switching transistors (or second thin film transistors) 360, one sampling transistor (or third thin film transistor) 340, and one storage capacitor (Cst) in the driving element portion of the display area AA, and at least one switching transistor (or fourth thin film transistor) 330 in the driving element unit (or the gate driving portion 103) of the non-display area NA.

Briefly expressing the configuration of one sub-pixel PX, it may be configured with a driving element portion on the substrate 101 and a light emitting element portion electrically connected to the driving element portion. The driving element portion may refer to an array portion that includes a driving transistor, a switching transistor (including a sampling transistor) and a storage capacitor to drive one sub-pixel. The light emitting element portion may refer to an array portion that includes an anode electrode, a cathode electrode, and a light emitting layer disposed therebetween to emit light. The driving element portion and the light emitting element portion may be insulated from each other by planarization layers 320 and 322.

According to the embodiment of the present disclosure, the driving transistor (or first thin film transistor) 370 and at least one switching transistor (or sampling transistor or third thin film transistor) 340 may use oxide semiconductor (or semiconductor oxide material) for semiconductor layers 315 and 312. A thin film transistor using an oxide semiconductor material as a semiconductor layer has excellent leakage current blocking effect and can thus reduce power consumption, and is relatively inexpensive to manufacture compared to a thin film transistor using a polycrystalline semiconductor material as a semiconductor layer.

The substrate 101 may be formed of multi-layers in which an organic layer and an inorganic layer are alternately stacked. For example, the substrate 101 may be configured by alternately stacking organic layers 101*a* and 101*c* such as polyimide and an inorganic layer 101*b* such as silicon oxide ($SiO2$).

A lower buffer layer 301 may be formed on the substrate 101. The lower buffer layer 301 may serve to block moisture that can permeate from the outside, and may be configured by forming a single layer of a silicon oxide ($SiO2$) layer or a nitric oxide (SiN) layer, or stacking multiple layers of a silicon oxide ($SiO2$) layer and a nitric oxide (SiN) layer. For example, the lower buffer layer 301 may have a stacked structure of a first lower buffer layer 301*a* and a second lower buffer layer 301*b* in order to increase blocking power against moisture or the like from the outside.

A fourth thin film transistor 330 may be formed in the driving element portion (or the gate driving portion 103) of the non-display area NA of the substrate 101. The fourth thin film transistor 330 may include a fourth semiconductor layer 303 including a channel through which electrons or holes move, a fourth gate electrode 306, a fourth source electrode 317S, and a fourth drain electrode 317D. In the fourth thin film transistor 330, the fourth semiconductor layer 303 may be formed of a polycrystalline semiconductor layer.

The fourth semiconductor layer 303 may be made of a polycrystalline semiconductor material, and a fourth channel region 303C may be formed in a center of the fourth semiconductor layer 303, and a fourth source region 303S and a fourth drain region 303D may be disposed with the fourth channel region 303C interposed therebetween.

The fourth channel region 303C is a region in which a polycrystalline semiconductor material maintains an intrinsic state, and may provide a path for electrons or holes to move.

The fourth source region 303S and the fourth drain region 303D may be conductive regions by doping an intrinsic polycrystalline semiconductor material with group 5 or group 3 impurity ions, for example, phosphorus (P) or boron (B) at a predetermined concentration.

The fourth thin film transistor 330 may include the fourth gate electrode 306 configured to overlap the fourth channel region 303C of the fourth semiconductor layer 303. A first gate insulating layer 302 may be interposed between the fourth gate electrode 306 and the fourth semiconductor layer 303.

According to the embodiment of the present disclosure, the fourth thin film transistor 330 may adopt a top gate method in which the fourth gate electrode 306 is positioned on the fourth semiconductor layer 303. Accordingly, since the first capacitor electrode 305 and light blocking layers (or lower gate electrodes) 304 and 308 made of the same material as the fourth gate electrode 306 may be formed through one mask process, an effect of reducing processes can be obtained.

The fourth gate electrode 306 may be made of a metal material. For example, the fourth gate electrode 306 may be formed of a single layer or multiple layers using at least one of molybdenum (Mo), aluminum (Al), chromium (Cr), gold (Au), titanium (Ti), nickel (Ni), neodymium (Nd), copper (Cu) and an alloy thereof, but is not limited thereto.

A first inter-layered insulating layer 307 may be disposed on the fourth gate electrode 306. The first inter-layered insulating layer 307 may be made of silicon nitride (SiNx). For example, the first inter-layered insulating layer 307 made of silicon nitride (SiNx) may include hydrogen particles. When the fourth semiconductor layer 303 is formed and the first inter-layered insulating layer 307 is deposited thereon and then a heat treatment process is performed, the hydrogen particles included in the first inter-layered insulating layer 307 may penetrate into the fourth source region. 303S and the fourth drain region 303D to contribute to improving and stabilizing conductivity of the polycrystalline semiconductor material. This is also called a hydrogenation process.

The fourth thin film transistor 330 may further include an upper buffer layer 310, a second gate insulating layer 313*a*, a third gate insulating layer 313*b*, and a second inter-layered insulating layer 316 over the first interlayer insulating layer 307, and may include a fourth source electrode 317S and a fourth drain electrode 317D formed on the second inter-layered insulating layer 316 and connected to the fourth source region 303S and the fourth drain region 303D, respectively.

The upper buffer layer 310 may separate the fourth semiconductor layer 303 made of a polycrystalline semiconductor material in the non-display area NA from the semiconductor layers 311, 312 and 315 of the thin film transistors made of an oxide semiconductor material in the display area AA, and may provide a basis on which the semiconductor layers 311, 312, and 315 of the thin film transistors of the display area AA are formed.

The second inter-layered insulating layer 316 or the third gate insulating layer 313*b* may be an interlayer insulating layer covering a first upper gate electrode 373 of the first thin film transistor 370, the second gate electrode 314 of the second thin film transistor 360, and the third gate electrode 344 of the third thin film transistor 340. The second inter-layered insulating layer 316 or the third gate insulating layer 313*b* may be formed over the first semiconductor layer 315, the second semiconductor layer 311, and the third semiconductor layer 312 made of an oxide semiconductor material, so that it may be formed of an inorganic film that does not contain hydrogen particles.

The fourth source electrode 317S and the fourth drain electrode 317D may be formed of a single layer or multiple layers using at least one of molybdenum (Mo), aluminum (Al), chromium (Cr), gold (Au), titanium (Ti), nickel (Ni), neodymium (Nd), copper (Cu) and an alloy thereof, but is not limited thereto.

Referring to FIG. 5, the first thin film transistor 370, the second thin film transistor 360, the third thin film transistor 340, and the storage capacitor 350 may be formed in the driving element portion of the display area AA of the substrate 101.

The first thin film transistor (or driving transistor D-TFT) 370 according to the embodiment of the present disclosure may be formed on the upper buffer layer 310. The first thin film transistor 370 may provide a driving current to the light emitting element ED according to the data voltage applied from the data line DL. The first thin film transistor 370 may include an oxide semiconductor layer or a polycrystalline semiconductor layer as the first semiconductor layer 315.

The thin film transistor including the polycrystalline semiconductor layer may generate leakage current in an off state, and thus may have power consumption greater than that of the thin film transistor including the oxide semiconductor layer. Meanwhile, in the case of the thin film transistor using the oxide semiconductor layer as a semiconductor layer, deterioration may be progressed by incident light on the semiconductor layer due to material characteristics of the oxide semiconductor. In the display apparatus according to the embodiment of the present disclosure, a structure in which a semiconductor layer of a thin film transistor in the display area AA is formed of an oxide semiconductor layer having a very low leakage current and reducing power consumption is proposed.

In the first thin film transistor 370 according to the embodiment of the present disclosure, the first semiconductor layer 315 may be formed of an oxide semiconductor layer. The first thin film transistor 370 may include the first semiconductor layer 315 formed of an oxide semiconductor layer, the second gate insulating layer 313*a* covering the first semiconductor layer 315, the first upper gate electrode 373 formed on the second gate insulating layer 313*a* and overlapping the first semiconductor layer 315, the third gate insulating layer 313*b* covering the first upper gate electrode 373, the second inter-layered insulating layer 316 formed on the third gate insulating layer 313*b*, and the first source electrode 375S and the first drain electrode 375D disposed on the second inter-layered insulating layer 316.

The first thin film transistor 370 may further include a first lower gate electrode (or a first light blocking layer) 371 disposed between the first upper buffer layer 310*a* and the second upper buffer layer 310*b* and overlapping the first semiconductor layer 315. The first lower gate electrode 371 may be formed in a form of being inserted into the upper buffer layer 310. For example, the first lower gate electrode 371 may be formed on the first upper buffer layer 310*a* disposed on the first inter-layered insulating layer 307, and the second upper buffer layer 310*b* may be formed on the first lower gate electrode 371 and the first upper buffer layer 310*a*. For example, the upper buffer layer 310 may have a structure in which the first upper buffer layer 310*a* and the second upper buffer layer 310*b* are sequentially stacked, but is not limited thereto.

The first upper buffer layer 310*a* may be made of silicon oxide (SiO2). Since the first upper buffer layer 310*a* may be formed of silicon oxide (SiO2) that does not contain hydrogen particles, it may be configured based on the first thin film transistor using an oxide semiconductor layer whose reliability may be damaged by hydrogen particles as the first semiconductor layer 315.

The second upper buffer layer 310*b* may be made of silicon nitride (SiNx) having an excellent ability to trap hydrogen particles. The second upper buffer layer 310*b* may cover top and side surfaces of the first lower gate electrode 371 to completely seal the first lower gate electrode 371.

Silicon nitride (SiNx) has a superior ability to trap hydrogen particles compared to silicon oxide (SiO2). The first inter-layered insulating layer 307 containing hydrogen particles is positioned below the upper buffer layer 310, and during a hydrogenation process of the fourth thin film transistor 330 including the fourth semiconductor layer 303 as a polycrystalline semiconductor layer, generated hydrogen particles may pass through the upper buffer layer 310 and damage reliability of the oxide semiconductor layer positioned on the upper buffer layer 310. For example, when hydrogen particles permeate the oxide semiconductor layer, thin film transistors may have different threshold voltages or may vary in conductivity of channel, depending on where they are formed. Among them, in the case of the driving thin film transistor, it directly contributes to operation of the light emitting element, so that it is important to secure reliability of an element.

In the embodiment of the present disclosure, since the second upper buffer layer 310*b* completely covering the first lower gate electrode 371 is formed on the first upper buffer layer 310*a*, reliability damage of the first thin film transistor 370 due to hydrogen particles can be prevented or at least reduced.

In the first thin film transistor 370 according to the embodiment of the present disclosure, the first lower gate electrode 371 may be formed of a metal layer including a titanium (Ti) material having excellent hydrogen particle trapping ability. For example, the first lower gate electrode 371 may be formed of a single layer of titanium (Ti), a double layer of molybdenum (Mo) and titanium (Ti), or an alloy of molybdenum (Mo) and titanium (Ti), but is not limited thereto.

Titanium (Ti) traps hydrogen particles diffusing in the upper buffer layer 310 and prevents or reduces the hydrogen particles from reaching the first semiconductor layer 315. In the first thin film transistor 370 according to the embodiment of the present disclosure, the first lower gate electrode 371 is formed of a metal layer such as titanium (Ti) having the ability to trap hydrogen particles, and further the second upper buffer layer 310*b* is formed of silicon nitride (SiNx) having the ability to trap hydrogen particles and surround the first lower gate electrode 371, so that it is possible to improve the problem of damage to the reliability of the oxide semiconductor layer due to hydrogen particles.

The second upper buffer layer 310*b* including silicon nitride (SiNx) may not be deposited over the entire surface of the display area AA like the first upper buffer layer 310*a*, but may be deposited only on a part of a top surface of the first upper buffer layer 310*a* to selectively cover only the first lower gate electrode 371. For example, the second upper buffer layer 310*b* may be formed of a layer of a material different from that of the first upper buffer layer 310*a*, and when the second upper buffer layer 310*b* is deposited over the entire surface of the display area AA, lifting of the layer may occur, and to compensate this, the second upper buffer layer 310*b* may be selectively formed only at a location, where the first lower gate electrode 371 is formed, required for its function.

The first lower gate electrode 371 and the second upper buffer layer 310*b* may be formed vertically below the first semiconductor layer 315 to overlap the first semiconductor layer 315 in terms of their functions. In addition, the first lower gate electrode 371 and the second upper buffer layer 310*b* may be formed wider than the first semiconductor layer 315 so as to completely overlap the first semiconductor layer 315.

The first source electrode 375S of the first thin film transistor 370 may be electrically connected to the first lower gate electrode 371. Since an effective voltage applied to the channel region 315C of the first semiconductor layer 315 is in inverse proportion to a parasitic capacitance (Cbuf) between the first semiconductor layer 315 and the first lower gate electrode 371, the effective voltage applied to the first semiconductor layer 315 may be adjusted. For example, if the first lower gate electrode 371 is placed close to the first semiconductor layer 315 to increase a value of the parasitic capacitance therebetween, an actual current value flowing through the first semiconductor layer 315 can be reduced, and this can widen a control range of the first thin film transistor 370 that can be controlled through the voltage applied to the first upper gate electrode 373. Accordingly, it is possible to precisely control the light emitting element even in low gray levels, and a problem of screen stain can be solved.

Referring to FIG. 5, the driving element portion of the display area AA according to the embodiment of the present disclosure may include the storage capacitor (Cst) 350. The storage capacitor 350 may store the data voltage applied through the data line DL for a certain period and provide it to the light emitting element ED.

The storage capacitor 350 may be configured with two electrodes corresponding to each other and a dielectric disposed therebetween. The storage capacitor 350 may include a first capacitor electrode 305 made of the same material as and disposed at the same layer as the fourth gate electrode 306, and a second capacitor electrode 309 made of the same material as and disposed at the same layer as the first lower gate electrode 371. The first inter-layer insulating layer 307 may be disposed between the first capacitor electrode 305 and the second capacitor electrode 309. The second capacitor electrode 309 of the storage capacitor 350 may be electrically connected to the first source electrode 375S.

Referring to FIG. 5, the driving element portion of the display area AA according to the embodiment of the present disclosure may include a plurality of second thin film transistors (e.g., switching transistors) 360. The plurality of second thin film transistors 360 may control driving of the first thin film transistor 370 according to a gate voltage applied from the gate line GL.

The second thin film transistor 360 may include the second semiconductor layer 311 disposed on the upper buffer layer 310 and formed of an oxide semiconductor layer, the second gate insulating layer 313*a* covering the second semiconductor layer 311, the second upper gate electrode 314 formed on the second gate insulating layer 313*a* and overlapping the second semiconductor layer 311, the third gate insulating layer 313*b* covering the second upper gate electrode 314, the second inter-layered insulating layer 316 formed on the third gate insulating layer 313*b*, and the second source electrode 319S and the second drain electrode 319D formed on the second inter-layered insulating layer 316.

The second thin film transistor 360 may further include the second lower gate electrode (or second light blocking layer) 308 disposed below the upper buffer layer 310 and overlapping the second semiconductor layer 311. For example, the second lower gate electrode 308 may be formed of the same material as the fourth gate electrode 306, and be formed on the top surface of the first gate insulating layer 302. The second lower gate electrode 308 may be electrically connected to the second upper gate electrode 314 to form a dual gate (or double gate). Since the second thin film transistor 360 has a dual gate structure, a flow of current flowing in the second channel region 311C of the second semiconductor layer 311 can be more precisely controlled, and the second thin film transistor 360 can be arranged in a smaller area to implement a high-resolution display apparatus.

The second semiconductor layer 311 may be made of an oxide semiconductor material, and may include the intrinsic second channel region 311C not doped with impurities, the second source region 311S and the second drain region 311D doped with impurities and made conductive.

Meanwhile, a distance between the second semiconductor layer 311 and at least one second gate electrode (e.g., the second lower gate electrode 308) may be greater than a distance between the first semiconductor layer 315 and at least one first gate electrode (e.g., the first lower gate electrode 371). Each thin film transistor may have different needs for precise control through a dual gate according to its unique function. For example, the first thin film transistor 370 has a first ratio between a current change amount of an organic light emitting diode (OLED) and a threshold voltage amount change of the first thin film transistor 370; the second thin film transistor 360 has a second ratio between a current amount change of the OLED and a threshold voltage amount change of the second transistor 360. Since the first ratio is greater than the second ratio, more precise control of the current amount of the OLED is required.

In some embodiments, to achieve precise control of the current amount of the organic light emitting diode (OLED), the distance between the first semiconductor layer 315 and the at least one first gate electrode (e.g., the first lower gate electrode 371) may be made shorter than the distance between the second semiconductor layer 311 and the at least one second gate electrode (e.g., the second lower gate electrode 308).

Like the fourth source electrode 317S and the fourth drain electrode 317D, the second source electrode 319S and the second drain electrode 319D may be formed of a single layer or multiple layers using at least one of molybdenum (Mo), aluminum (Al), chromium (Cr), gold (Au), titanium (Ti), nickel (Ni), neodymium (Nd), copper (Cu) and an alloy thereof, but is not limited thereto.

The second source electrode 319S and the second drain electrode 319D may be simultaneously formed of the same material as the fourth source electrode 317S and the fourth drain electrode 317D on the second inter-layered insulating layer 316, and thus a number of mask processes can reduce.

Referring to FIG. 5, the driving element portion of the display area AA according to the embodiment of the present disclosure may include the third thin film transistor (e.g., sampling transistor) 340. The third thin film transistor 340 may sense the threshold voltage of the first thin film transistor 370 and compensate for a change in the threshold voltage, and thus may control driving of the first thin film transistor 370.

The third thin film transistor 340 may be formed on the upper buffer layer 310 and may include the third semiconductor layer 312 formed of an oxide semiconductor layer, the second gate insulating layer 313*a* covering the third semiconductor layer 312, the third gate insulating layer 313*b* covering the second gate insulating layer 313*a*, the third upper gate electrode 344 formed on the third gate insulating layer 313*b* and overlapping the third semiconductor layer 312, the second inter-layered insulating layer 316 covering the third upper gate electrode 344, and the third source electrode 328S and the third drain electrode 328D formed on the second inter-layered insulating layer 316.

The third thin film transistor 340 may further include the third lower gate electrode (or third light blocking layer) 304 disposed below the upper buffer layer 310 and overlapping the third semiconductor layer 312. In particular, the third lower gate electrode 304 may be formed of the same material as the fourth gate electrode 306 and be formed on the top surface of the first gate insulating layer 302. The third lower gate electrode 304 may be electrically connected to the third upper gate electrode 344 to form a dual gate. Since the third thin film transistor 340 has a dual gate structure, a flow of current flowing in the third channel region 312C of the third semiconductor layer 312 can be more precisely controlled, and the third thin film transistor 340 can be arranged in a smaller area to implement a high-resolution display apparatus.

The third semiconductor layer 312 may be made of an oxide semiconductor material, and may include the intrinsic third channel region 312C not doped with impurities, the third source region 312S and the third drain region 312D doped with impurities and made conductive.

Meanwhile, a distance between the third semiconductor layer 312 and at least one third gate electrode (e.g., the third lower gate electrode 304) may be greater than the distance between the first semiconductor layer 315 and the at least one first gate electrode (e.g., the first lower gate electrode 371). Each thin film transistor may have different needs for precise control through a dual gate according to its unique function. For example, since the third thin film transistor 340 has a ratio of an amount of change in current amount of an organic light emitting diode (OLED) to an amount of change in threshold voltage thereof greater than a ratio of an amount of change in current amount of the organic light emitting diode (OLED) to an amount of change in threshold voltage of the plurality of first thin film transistors 370, more precise control is required. For precise control of the current amount of the organic light emitting diode (OLED), the distance between the first semiconductor layer 315 and the at least one first gate electrode (e.g., the first lower gate electrode 371) may be made smaller than the distance between the third semiconductor layer 312 and the at least one third gate electrode (e.g., the third lower gate electrode 304).

By applying the same principle, the distance between the third semiconductor layer 312 and the third upper gate electrode 344 may be greater than the distance between the first semiconductor layer 315 and the first upper gate electrode 373 or the distance between the second semiconductor layer 311 and the second upper gate electrode 314. For example, since a ratio of an amount of change in current amount of the organic light emitting diode (OLED) to an amount of change in threshold voltage of each thin film transistor is different, for more precise control of the current amount of the organic light emitting diode (OLED), a double gate (or dual gate) structure may be adopted, and the distance between the semiconductor layer and the upper gate electrode of each of the first thin film transistor 370 and the second thin film transistor 360 may be smaller than the distance between the third semiconductor layer 312 and the third upper gate electrode 344.

The parasitic capacitance between the third semiconductor layer 312 and the third upper gate electrode 344 may be smaller than the parasitic capacitance between the first semiconductor layer 315 and the first upper gate electrode 373 or the second semiconductor layer 311 and the second upper gate electrode 314. Since a capacitance is inversely proportional to a distance between two electrodes, when an area between the semiconductor layer and the upper gate electrode of each thin film transistor is the same, a magnitude relationship between parasitic capacitances of the thin film transistors occurs. Applying the reverse principle, a placement position (or layer) of the third upper gate electrode 344 may be different from a placement position (or layer) of the first upper gate electrode 373 or a placement position (or layer) of the second upper gate electrode 314.

Like the fourth source electrode 317S and the fourth drain electrode 317D, the third source electrode 328S and the third drain electrode 328D may be formed of a single layer or multiple layers using at least one of molybdenum (Mo), aluminum (Al), chromium (Cr), gold (Au), titanium (Ti), nickel (Ni), neodymium (Nd), copper (Cu) and an alloy thereof, but is not limited thereto.

The third source electrode 328S and the third drain electrode 328D may be simultaneously formed of the same material as the fourth source electrode 317S and the fourth drain electrode 317D on the second inter-layered insulating layer 316, and thus a number of mask processes can reduce.

The third upper gate electrode 344 may be formed on the second gate insulating layer 313*a* like the first upper gate electrode 373 or the second upper gate electrode 314, but is not limited thereto. For example, the third upper gate electrode 344 may not be formed on the second gate insulating layer 313*a*, but may be formed on the third gate insulating layer 313*b*.

An effective voltage applied to the third channel region 312C of the third semiconductor layer 312 is inversely proportional to the parasitic capacitance (Cgi) between the third semiconductor layer 312 and the third upper gate electrode 34, and the effective voltage applied to the third semiconductor layer 312 may be adjusted by adjusting the distance between the third semiconductor layer 312 and the third upper gate electrode 344.

Meanwhile, according to the embodiment of the present disclosure, the first upper gate electrode 373 of the first thin film transistor 370, the second upper gate electrode 314 of the plurality of second thin film transistors 360 and the third upper gate electrode 344 of the third thin film transistor 340 configured in the display area AA may each be configured in multiple layers which include a lower portion of titanium (Ti) and an upper portion of a metal other than titanium (Ti) such as molybdenum (Mo).

When each of the upper gate electrodes 373, 314 and 344 of the above thin film transistors 370, 360 and 340 is formed of a plurality of metal layers including titanium (Ti), the metal layers including titanium (Ti) block hydrogen particles that may descend from above the thin film transistors 370, 360 and 340, so that the semiconductor layers 315, 311 and 312 may be protected.

Since the driving element portion of the display apparatus 100 is configured with a plurality of thin film transistors including different types of semiconductor layers, a plurality of layers may be required, and a large number of masks must be used in processes for the layers. In the embodiment of the present disclosure, in order to reduce the number of masks used, a configuration in which elements of a plurality of transistors are simultaneously formed for each layer on which each element is disposed is followed.

For example, the fourth gate electrode 306, the first capacitor electrode 305, the third lower gate electrode 304, and the second lower gate electrode 308 according to the embodiment of the present disclosure may be formed of the same material and at the same layer. For example, the second capacitor electrode 309 and the first lower gate electrode 371 according to the embodiment of the present disclosure may be formed of the same material and at the same layer. For example, the third semiconductor layer 312, the first semiconductor layer 315, and the second semiconductor layer 311 according to the embodiment of the present disclosure may be formed of the same material and at the same layer, and may undergo the same conductorization process. For example, the third upper gate electrode 344, the first upper gate electrode 373, and the second upper gate electrode 314 according to the embodiment of the present disclosure may be formed of the same material and at the same layer. For example, the fourth source electrode 317S, the fourth drain electrode 317D, the third source electrode 328S, the third drain electrode 328D, the first source electrode 375S, the first drain electrode 375D, the second source electrode 319S, and the second drain electrode 319D may be formed of the same material and at the same layer, and each electrode may include a plurality of layers of two or more layers.

Referring to FIG. 5, a first planarization layer 320 and a second planarization layer 322 may be sequentially formed on a top of the driving element portion according to the embodiment of the present disclosure to planarize (or flatten) steps caused by height differences of various components. The first planarization layer 320 and the second planarization layer 322 may be formed of an organic material such as polyimide or acrylic resin.

Referring to FIG. 5, the light emitting element portion may be formed on the second planarization layer 322. The light emitting element portion may include the first electrode (or anode electrode) 323, the second electrode (or cathode electrode) 327 corresponding to the first electrode 323, and the light emitting layer 325 interposed between the first electrode 323 and the second electrode 327. The first electrode 323 may be formed for each sub-pixel PX, and the light emitting layer 325 and the second electrode 327 may be formed over the entire area of the display area AA.

The light emitting element portion may be connected to the driving element portion through a third electrode (or connection electrode) 321 formed on the first planarization layer 320. For example, the first electrode 323 of the light emitting element portion, and the first drain electrode 375D of the first thin film transistor 370 or the second source electrode 319S of any one of the second thin film transistors 360 forming the driving element portion may be connected to each other by the third electrode 321.

The first electrode 323 may be connected to the third electrode 321 through a contact hole CH1 penetrating the second planarization layer 322. The third electrode 321 may be connected to the first drain electrode 375D exposed through a contact hole CH2 penetrating the first planarization layer 320.

The first electrode 323 may have a multi-layered structure including a transparent conductive layer and an opaque conductive layer having high reflective efficiency. The transparent conductive layer may be made of a material having a relatively high work function value, such as indium-tin-oxide (ITO) or indium-zinc-oxide (IZO), and the opaque conductive layer may have a single-layered or multi-layered structure including at least one of aluminum (Al), silver (Ag), copper (Cu), lead (Pb), molybdenum (Mo), titanium (Ti) and an alloy thereof. For example, the first electrode 323 may be formed of a structure in which a transparent conductive layer, an opaque conductive layer, and a transparent conductive layer are sequentially stacked, or a structure in which a transparent conductive layer and an opaque conductive layer are sequentially stacked.

The light emitting layer 325 may be formed by stacking a hole related layer, an organic light emitting layer, and an electron related layer on the first electrode 323 in the order or reverse order. The light emitting layer 325 may be integrally formed over the entire surface of the display area AA.

A bank layer 324 may be a pixel defining layer exposing the first electrode 323 of each sub-pixel PX. The bank layer 324 may be formed of an opaque material (e.g., black material) to prevent or reduce light interference between adjacent sub-pixels PX. For example, the bank layer 324 may include a light blocking material made of any one of color pigments, organic black material, and carbon. A spacer 326 may be further disposed on the bank layer 324.

The second electrode 327 may face the first electrode 323 with the light emitting layer 325 interposed therebetween and may be formed on a top surface and side surfaces of the light emitting layer 325. The second electrode 327 may be integrally formed over the entire surface of the display area AA. When the second electrode 327 is applied to a top emission organic light emitting display apparatus, the second electrode 327 may be formed of a transparent conductive layer such as indium-tin-oxide (ITO) or indium-zinc-oxide (IZO).

Referring to FIG. 5, an encapsulation portion 328 for suppressing moisture permeation may be further disposed on the second electrode 327. The encapsulation portion 328 may include a first encapsulation layer 328*a*, a second encapsulation layer 328*b*, and a third encapsulation layer 328*c* sequentially stacked.

The first encapsulation layer 328*a* and the third encapsulation layer 328*c* of the encapsulation portion 328 may be formed of an inorganic material such as silicon oxide (SiOx). The second encapsulation layer 328*b* of the encapsulation portion 328 may be formed of an organic material such as acrylic resin, epoxy resin, phenolic resin, polyamide resin, or polyimide resin.

Referring to FIG. 5, a touch portion (or touch sensor portion) may be further disposed on the encapsulation portion 328. The touch portion may be configured with a touch buffer layer 710, a touch insulating layer 730, and a touch protection layer 750, and may include a plurality of touch electrodes TE and a plurality of connection electrodes BE. The plurality of touch electrodes TE according to the embodiment of the present disclosure may include a plurality of first touch electrode channels TX1 to TXn which configured by connecting the plurality of first touch electrodes TE1 arranged in a first direction (or X-axis direction, or horizontal direction), and a plurality of second touch electrode channels RX1 to RXm configured by connecting a plurality of second touch electrodes TE2 arranged in a second direction (or Y-axis direction, or vertical direction). Each of the plurality of touch electrodes TE and each of the plurality of connection electrodes BE may be configured to be arranged at the same layer or different layers using the touch insulating layer 730 between the touch buffer layer 710 and the touch protection layer 750.

In the display apparatus 100 according to the embodiment of the present disclosure, a color filter layer may be disposed on the touch portion or between the touch portion and the encapsulation portion 328. The color filter layer may be disposed on the touch portion or disposed between the touch portion and the encapsulation portion 328 in order to increase purity of light emitted from the light emitting element ED for each sub-pixel PX.

Figure 6:
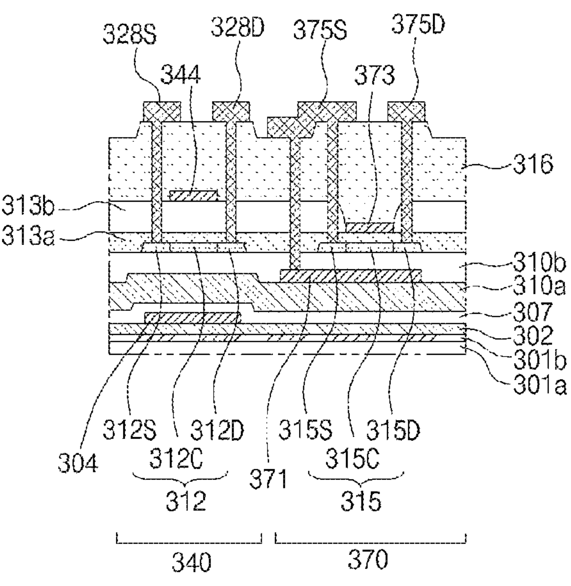
FIG. 6 is an enlarged view of a partial area of FIG. 5 according to an embodiment of the present disclosure.

FIG. 6 is an enlarged view of a partial area of FIG. 5 according to an embodiment of the present disclosure. A description of components of FIG. 6 may be omitted or simplified since they are substantially the same as those of FIG. 5.

Referring to FIG. 6, a top surface of the first upper gate electrode 373 of the first thin film transistor 370 may be covered with the second inter-layered insulating layer 316. For example, the second inter-layered insulating layer 316 may cover not only the top surface of the first upper gate electrode 373, but also the top surface of the second upper gate electrode 314 and the top surface of the third upper gate electrode 344. In this regard, in terms of process, after the third gate insulating layer 313*b* is formed on the second gate insulating layer 313*a*, the third gate insulating layer 313*b* at positions where the first upper gate electrode 373 and the second upper gate electrode 314 are formed is removed, so that each upper gate electrode can be formed of the same material in a single process.

Material layers in contact with respective bottom surfaces of the first upper gate electrode 373, the second upper gate electrode 314 and the third upper gate electrode 344 may be different from each other. For example, the bottom surface of the first upper gate electrode 373 may contact the second gate insulating layer 313*a*, and the lower surface of the third upper gate electrode 344 may contact the third gate insulating layer 313*b*.

A thickness (or height) of the third gate insulating layer 313*b* may be equal to a distance between the third semiconductor layer 312 and the third upper gate electrode 344 of the third thin film transistor 340. For example, to adjust a parasitic capacitance between the third semiconductor layer 312 and the third upper gate electrode 344, the thickness of the third gate insulating layer 313*b* may be adjusted.

According to the embodiment of the present disclosure, by reducing a parasitic capacitance of a sampling transistor while maintaining a voltage-current characteristics of the driving transistor inside the display apparatus, it is possible to improve non-uniformity of initial luminance of the display apparatus and decrease in luminance during a reliability test. In addition, through a structure in which a thickness (or height) of a gate insulating layer of each transistor is differently designed, performance and optimum characteristics of each transistor can be secured.

A display apparatus according to embodiments of the present disclosure may be described as follows.

A display apparatus according to an embodiment of the present disclosure may include a substrate including a display area, and a non-display area that includes a wiring portion, a dam portion and a gate driving portion, a pixel in the display area, connected to a gate line and a data line crossing the gate line, and including a light emitting element that includes a first electrode, a light emitting layer and a second electrode, a first thin film transistor providing a driving current to the light emitting element according to a data voltage applied from the data line, and including a first semiconductor layer, a plurality of second thin film transistors controlling driving of the first thin film transistor according to a gate voltage applied from the gate line, and including a second semiconductor layer, a third thin film transistor sensing a threshold voltage of the first thin film transistor to control driving of the first thin film transistor, and including a third semiconductor layer, and a fourth thin film transistor disposed in the gate driving portion, applying gate voltages to the plurality of second thin film transistors and the third thin film transistor, and including a fourth semiconductor layer, and the fourth semiconductor layer may be disposed at a different layer from the first semiconductor layer, the second semiconductor layer and the third semiconductor layer.

According to some embodiments of the present disclosure, a first upper gate electrode on the first semiconductor layer, a second upper gate electrode on the second semiconductor layer, and a third upper gate electrode on the third semiconductor layer may be further included.

According to some embodiments of the present disclosure, a distance between the third semiconductor layer and the third upper gate electrode may be greater than a distance between the first semiconductor layer and the first upper gate electrode.

According to some embodiments of the present disclosure, a capacitance between the third semiconductor layer and the third upper gate electrode may be smaller than a capacitance between the first semiconductor layer and the first upper gate electrode.

According to some embodiments of the present disclosure, the third upper gate electrode may be disposed at a different layer from the first upper gate electrode.

According to some embodiments of the present disclosure, a distance between the third semiconductor layer and the third upper gate electrode may be greater than the distance between the second semiconductor layer and the second upper gate electrode.

According to some embodiments of the present disclosure, a capacitance between the third semiconductor layer and the third upper gate electrode may be smaller than a capacitance between the second semiconductor layer and the second upper gate electrode.

According to some embodiments of the present disclosure, the third upper gate electrode may be disposed at a different layer from the second upper gate electrode.

According to some embodiments of the present disclosure, top surfaces of the first, second and third upper gate electrodes may be covered by the same material.

According to some embodiments of the present disclosure, bottom surfaces of the first, second and third upper gate electrodes may contact different materials.

According to some embodiments of the present disclosure, a first lower gate electrode below the first semiconductor layer, a second lower gate electrode below the second semiconductor layer, and a third lower gate electrode under the third semiconductor layer may be further included.

According to some embodiments of the present disclosure, a distance between the second semiconductor layer and the second lower gate electrode may be greater than a distance between the first semiconductor layer and the first lower gate electrode.

According to some embodiments of the present disclosure, a distance between the third semiconductor layer and the third lower gate electrode may be greater than a distance between the first semiconductor layer and the first lower gate electrode.

According to some embodiments of the present disclosure, the first semiconductor layer and the second semiconductor layer may be oxide semiconductor layers.

According to some embodiments of the present disclosure, the third semiconductor layer may be an oxide semiconductor layer.

According to some embodiments of the present disclosure, the first thin film transistor may further include a first source electrode and a first drain electrode, the second thin film transistor may further include a second source electrode and a second drain electrode, the third thin film transistor may further include a third source electrode and a third drain electrode, and the first source electrode may be connected to the first lower gate electrode.

According to some embodiments of the present disclosure, the fourth semiconductor layer may be a polycrystalline semiconductor layer.

According to some embodiments of the present disclosure, an encapsulation portion disposed on the light emitting element, and including a first encapsulation layer, a second encapsulation layer and a third encapsulation layer, and a touch portion disposed on the encapsulation portion may be further included.

According to some embodiments of the present disclosure, a color filter layer disposed on the touch portion or between the touch portion and the encapsulation portion may be further included.

Although the embodiments of the present disclosure are described above in more detail with reference to the accompanying drawings, the present disclosure is not necessarily limited to these embodiments, and may be variously modified and implemented without departing from the technical idea of the present disclosure. Therefore, the embodiments disclosed in the present disclosure are not intended to limit the technical idea of the present disclosure, but to explain, and the scope of the technical idea of the present disclosure is not limited by these embodiments. Therefore, it should be understood that the embodiments described above are illustrative in all respects and not restrictive. The protection scope of the present disclosure may be construed according to the scope of the claims, and all technical ideas within the scope equivalent thereto should be construed as being included in the scope of the present disclosure.

What is claimed is:

1. A display apparatus, comprising:

a substrate including a display area, and a non-display area that includes a wiring portion, a dam portion and a gate driving portion;

a pixel in the display area, electrically connected to a gate line and a data line crossing the gate line, the pixel including a light emitting element, wherein the light emitting element includes a first electrode, a light emitting layer and a second electrode;

a first thin film transistor configured to provide a driving current to the light emitting element according to a data voltage applied from the data line, the first thin film transistor including a first semiconductor layer;

a second thin film transistor configured to control driving of the first thin film transistor according to a gate voltage applied from the gate line, the second thin film transistor including a second semiconductor layer;

a third thin film transistor configured to sense a threshold voltage of the first thin film transistor to control driving of the first thin film transistor, the third thin film transistor including a third semiconductor layer;

a fourth thin film transistor in the gate driving portion, configured to apply gate voltages to the second thin film transistor and the third thin film transistor, the fourth thin film transistor including a fourth semiconductor layer;

a first upper gate electrode above the first semiconductor layer;

a second upper gate electrode above the second semiconductor layer;

a third upper gate electrode above the third semiconductor layer;

a first insulating layer on the first semiconductor layer, the second semiconductor layer, and the third semiconductor layer, wherein the first upper gate electrode and the second upper gate electrode are directly on the first insulating layer; and a second insulating layer on the first insulating layer, the first upper gate electrode, and the second upper gate electrode, wherein the third upper gate electrode is directly on the second insulating layer, wherein the fourth semiconductor layer is at a different layer from the first semiconductor layer, the second semiconductor layer and the third semiconductor layer.

2. The display apparatus of claim 1, wherein a distance between the third semiconductor layer and the third upper gate electrode is greater than a distance between the first semiconductor layer and the first upper gate electrode, and wherein a capacitance between the third semiconductor layer and the third upper gate electrode is smaller than a capacitance between the first semiconductor layer and the first upper gate electrode.

3. The display apparatus of claim 2, wherein the third upper gate electrode is at a different layer from the first upper gate electrode.

4. The display apparatus of claim 1, wherein a distance between the third semiconductor layer and the third upper gate electrode is greater than a distance between the second semiconductor layer and the second upper gate electrode, and wherein a capacitance between the third semiconductor layer and the third upper gate electrode is smaller than a capacitance between the second semiconductor layer and the second upper gate electrode.

5. The display apparatus of claim 4, wherein the third upper gate electrode is at a different layer from the second upper gate electrode.

6. The display apparatus of claim 1, wherein top surfaces of the first upper gate electrode, second upper gate electrode, and third upper gate electrode are covered by a same material.

7. The display apparatus of claim 6, wherein bottom surfaces of the first upper gate electrode, second upper gate electrode, and third upper gate electrode contain different materials.

8. The display apparatus of claim 1, further comprising:

a first lower gate electrode below the first semiconductor layer;

a second lower gate electrode below the second semiconductor layer; and a third lower gate electrode below the third semiconductor layer.

9. The display apparatus of claim 8, wherein a distance between the second semiconductor layer and the second lower gate electrode is greater than a distance between the first semiconductor layer and the first lower gate electrode.

10. The display apparatus of claim 8, wherein a distance between the third semiconductor layer and the third lower gate electrode is greater than a distance between the first semiconductor layer and the first lower gate electrode.

11. The display apparatus of claim 1, wherein the first semiconductor layer and the second semiconductor layer comprise an oxide semiconductor material, and wherein the third semiconductor layer comprises an oxide semiconductor material.

12. The display apparatus of claim 8, wherein the first thin film transistor further includes a first source electrode and a first drain electrode, wherein the second thin film transistor further includes a second source electrode and a second drain electrode, wherein the third thin film transistor further includes a third source electrode and a third drain electrode, and wherein the first source electrode is electrically connected to the first lower gate electrode.

13. The display apparatus of claim 8, wherein the fourth semiconductor layer comprises a polycrystalline semiconductor material.

14. The display apparatus of claim 1, further comprising:

an encapsulation portion disposed on the light emitting element, the encapsulation portion including a first encapsulation layer, a second encapsulation layer and a third encapsulation layer; and a touch portion on the encapsulation portion.

15. The display apparatus of claim 1, wherein the second insulating layer includes a hole on the first upper gate electrode.

* * * * *